(12) United States Patent
Kawashima

(10) Patent No.: US 6,946,311 B2
(45) Date of Patent: Sep. 20, 2005

(54) PROCESSING APPARATUS AND WAFER PROCESSING METHOD

(75) Inventor: Isamu Kawashima, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 10/853,511

(22) Filed: May 25, 2004

(65) Prior Publication Data

US 2004/0241963 A1 Dec. 2, 2004

(30) Foreign Application Priority Data

Jun. 2, 2003 (JP) ........................................ 2003-156690

(51) Int. Cl.$^7$ ............................................... H01L 21/00
(52) U.S. Cl. ..................... 438/33; 438/113; 438/114; 438/118; 438/121
(58) Field of Search ........................... 438/33, 113–114, 438/118, 121

(56) References Cited

U.S. PATENT DOCUMENTS

| 6,045,626 | A | * | 4/2000 | Yano et al. ................. 148/33.4 |
| 6,294,440 | B1 | * | 9/2001 | Tsuda et al. ................. 438/479 |
| 6,750,074 | B2 | * | 6/2004 | Teshirogi et al. ............. 438/33 |
| 6,837,776 | B2 | * | 1/2005 | Shimobeppu et al. ......... 451/41 |

FOREIGN PATENT DOCUMENTS

| JP | 7-183365 | 7/1995 |
| JP | 10-27836 | 1/1998 |
| JP | 10-284564 | 10/1998 |

OTHER PUBLICATIONS

Patent Abstracts of Japan; Publication No. 10027836; Publication Date Jan. 27, 1998.
Patent Abstracts of Japan; Publication No. 10284564; Publication Date Oct. 23, 1998.
Patent Abstracts of Japan, Publication No. 07183365; Publication Date Jul. 21, 1995.

* cited by examiner

*Primary Examiner*—Luan Thai
(74) *Attorney, Agent, or Firm*—Christie, Parker & Hale, LLP

(57) ABSTRACT

There are provide a wafer processing method comprising the steps of securing the entirety of a wafer which is provided, on its right side, with a surface protection tape adhered thereto, to a frame by a dicing tape adhered to the underside of the wafer; irradiating the dicing tape of the wafer with ultraviolet light; and detaching the surface protection tape from the right side of the wafer, wherein the order of the occurrence of an irradiating operation for irradiating the dicing tape with ultraviolet light by the ultraviolet light irradiating portion and a detaching operation for detaching the surface protection tape by the detaching portion is determined based on a relation between the adhesive force of the surface protection tape and the adhesive force of the dicing tape before and after an ultraviolet light irradiating operation carried out by the ultraviolet light irradiating portion, and a wafer processing apparatus for carrying out the method. The apparatus may further comprise a recognizing portion which reads and recognizes a recognition mark provided on at least one of the wafer and the frame. Thus, the order of the occurrence of an ultraviolet light irradiating operation and a surface protection tape detaching operation is determined.

8 Claims, 7 Drawing Sheets

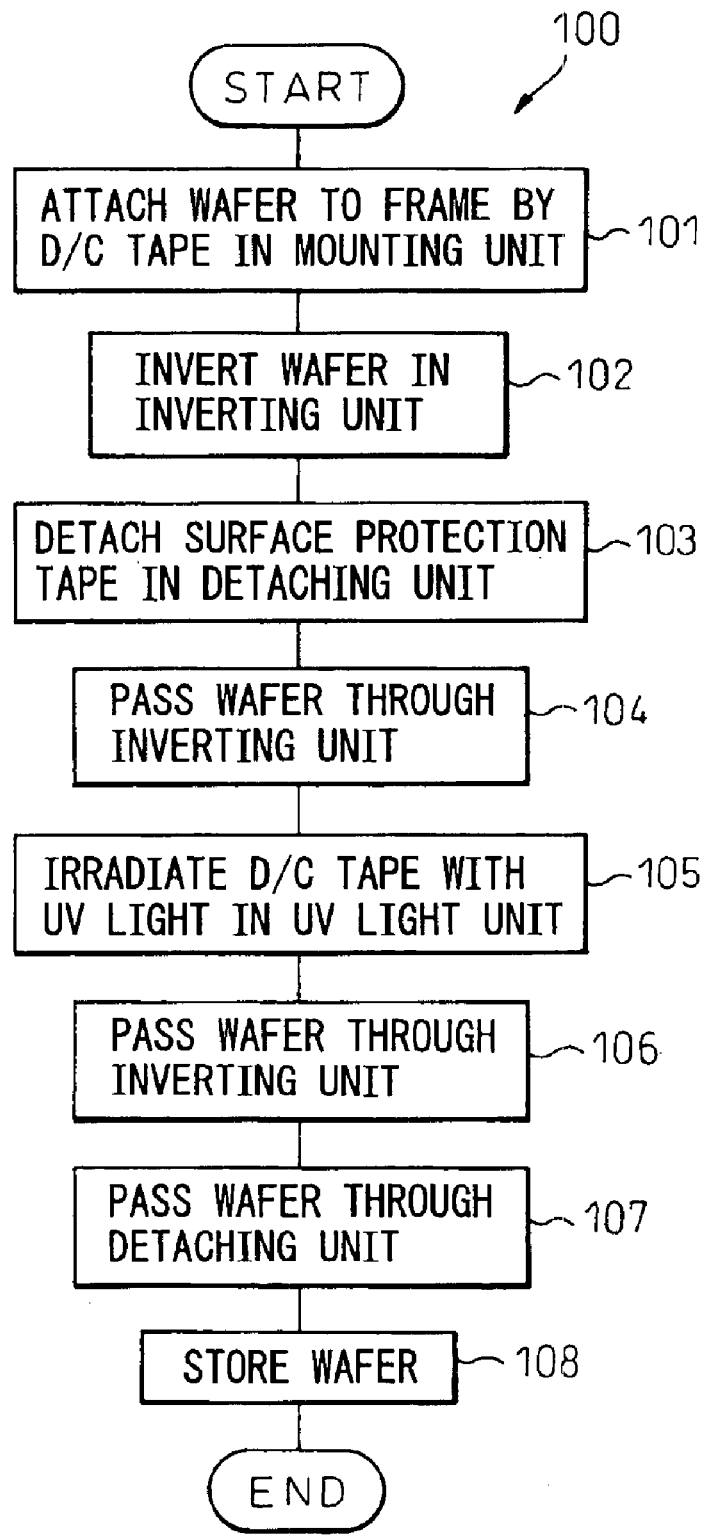

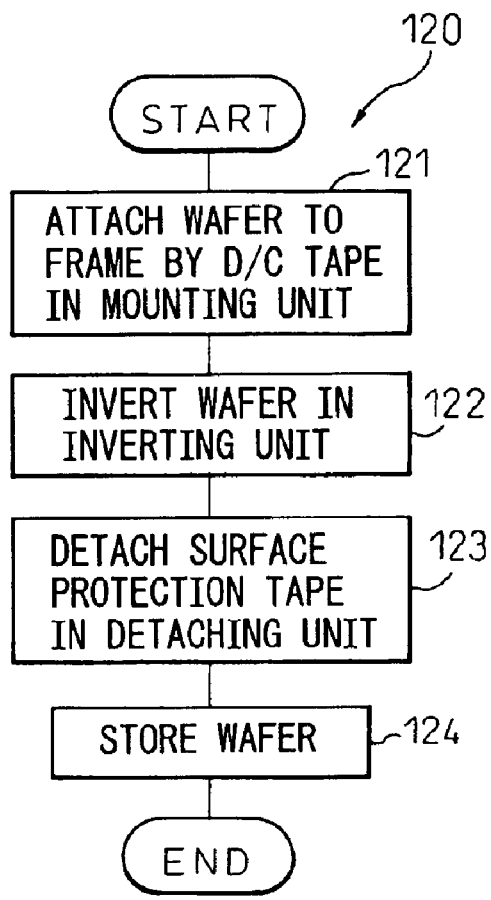
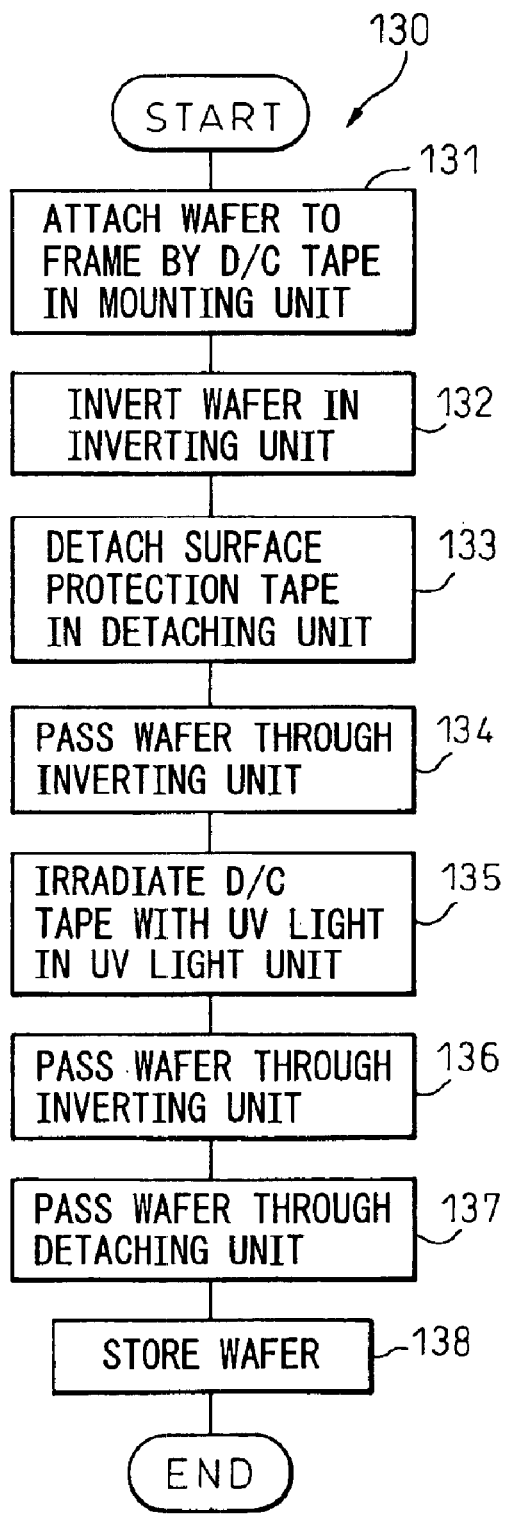

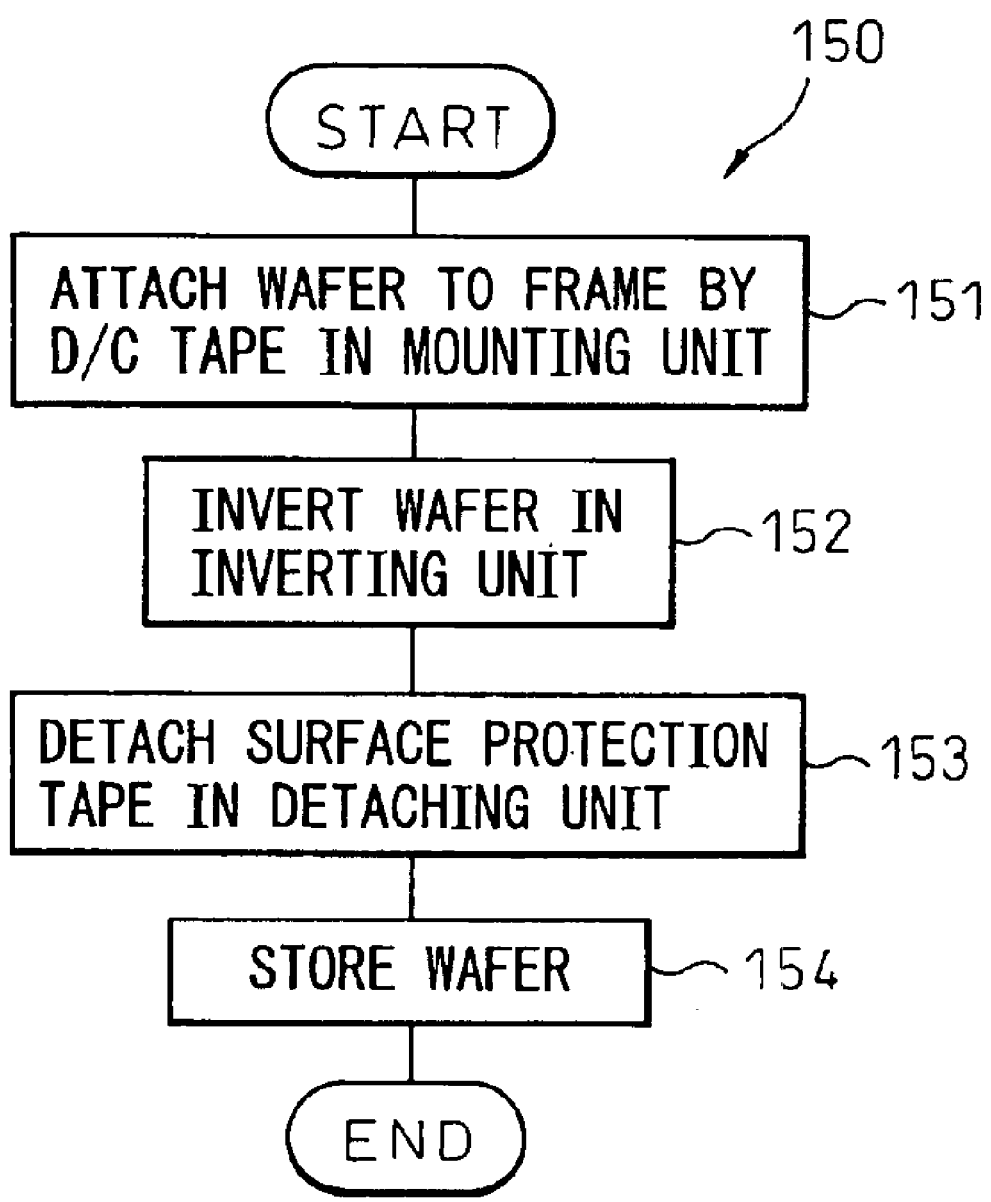

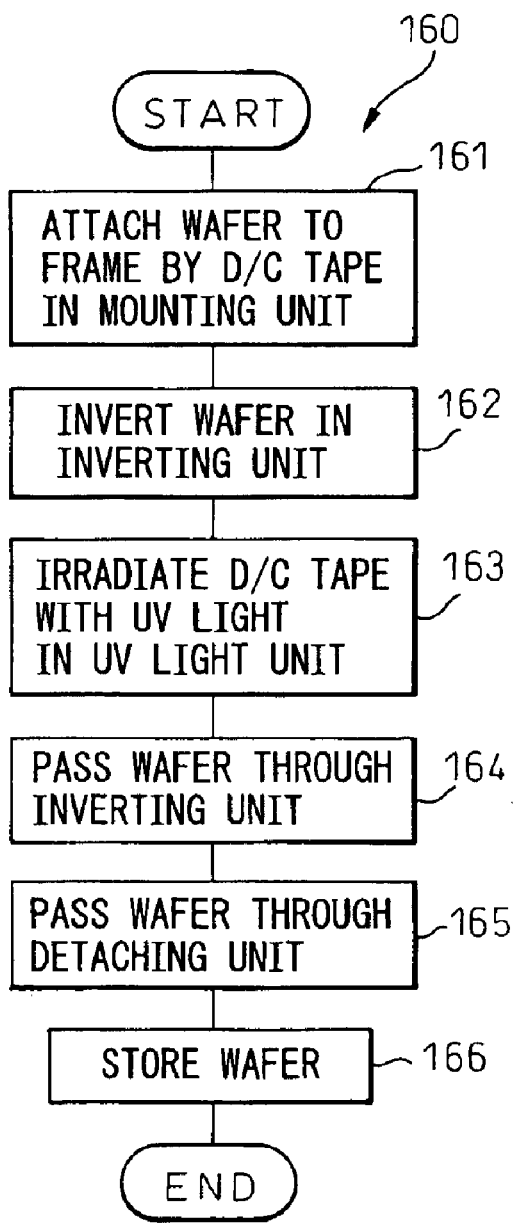
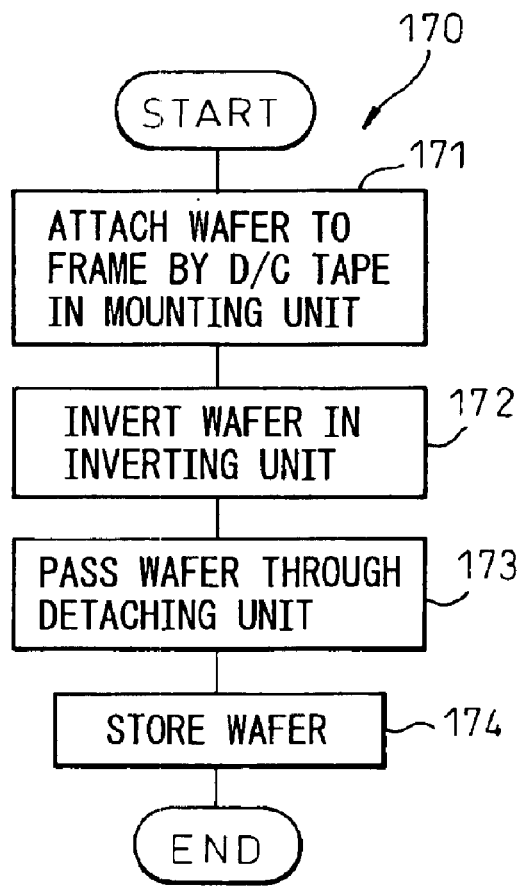

PROCESSING APPARATUS AND WAFER PROCESSING METHOD

CROSS REFERENCE TO RELATED APPLICATION

This application claims priority of Japan Patent Application Number 2003-156690, filed on Jun. 2, 2003.

TECHNICAL FIELD

The present invention relates to method and apparatus for processing a wafer having a surface to which a surface protection tape is adhered.

BACKGROUND ART

In the semiconductor manufacturing field, the size of a wafer tends to increase year by year. In order to improve a packing density, the thickness of a wafer tends to be reduced. In order to reduce the thickness of a wafer, an underside grinding operation is carried out, i.e., a surface protection tape is adhered to a right side of a wafer provided with a plurality of semiconductor devices, and, then, the underside of the wafer is ground while the surface of the wafer is sucked and held. After that, a dicing operation is carried out, i.e., the wafer is cut into dice. The wafer is attached to a frame because the mechanical strength of a thin wafer whose underside is ground is remarkably reduced and, thus, it is easy to handle the wafer in a subsequent process in which, for example, a dicing operation is carried out. FIG. 2b is a sectional view of a wafer attached to a frame. As shown in FIG. 2b, after a dicing tape 21 is adhered to the underside of a wafer 12 whose right side is usually provided with a surface protection tape 11, the wafer 12 is mounted to a frame 15 together with the dicing tape 21 and, then, the dicing tape 21 is appropriately cut. After the surface protection tape 11 is detached, the wafer is diced in a dicing process. The dicing tape 21 to be used usually has a property in which the hardness thereof is increased and the adhesive force thereof is reduced due to ultraviolet light irradiation. Therefore, the dicing tape 21 is cured to a certain extent by irradiating the dicing tape 21 with ultraviolet light and, thus, a portion of the dicing tape 21 is prevented from being adhered to a blade of a dicer in the dicing process (See, for example, Japanese Unexamined Patent Publication (Kokai) No. 10-27836, Japanese Unexamined Patent Publication (Kokai) No. 10-284564 and Japanese Unexamined Patent Publication (Kokai) No. 7-183365).

However, there are, in fact, various kinds of the surface protection tape 11 and the dicing tape 21 which have different properties. In, for example, the surface protection tape 11, there are a tape having a property in which the hardness thereof is increased and the adhesive force thereof is reduced due to ultraviolet light irradiation, and a tape having a property in which the hardness and adhesive force thereof do not vary when it is subject to ultraviolet light irradiation. Likewise, in the dicing tape 21, there are a tape having a property in which the hardness thereof is increased and the adhesive force thereof is reduced due to ultraviolet light irradiation, and a tape having a property in which the hardness and the like thereof do not vary when it is subject to ultraviolet light irradiation. Therefore, it is preferable that the wafer be processed in view of the properties of the surface protection tape 11 and the dicing tape 21.

Especially, when the dicing tape 21 having a property in which the adhesive force thereof is reduced due to ultraviolet light irradiation, is used, and the surface protection tape 11 is detached after the dicing tape 21 is irradiated with ultraviolet light, the surface protection tape 11 sometimes pulls the wafer 12 to damage the wafer because there is a possibility that the adhesive force of the surface protection tape 11 may be larger than that of the dicing tape 11. Therefore, it is extremely important to handle the wafer 12 in accordance with the properties of the surface protection tape 11 and the dicing tape 21 and, particularly, the reaction with ultraviolet light.

DISCLOSURE OF THE INVENTION

According to an aspect of the present invention, there is provided a wafer processing apparatus comprising a mounting means in which a dicing tape is adhered to the underside of a wafer having a right side to which a surface protection tape is adhered, and the entirety of the wafer is secured to a frame; an ultraviolet light irradiating means which irradiates the dicing tape of the wafer with ultraviolet light; and a detaching means in which the surface protection tape is detached from the right side of the wafer, wherein the order of the occurrence of an irradiating operation for irradiating the dicing tape with ultraviolet light by the ultraviolet light irradiating means and a detaching operation for detaching the surface protection tape by the detaching means is determined, based on a relation between the adhesive force of the surface protection tape and the adhesive force of the dicing tape before and after an ultraviolet light irradiating operation carried out by the ultraviolet light irradiating means.

According to another aspect of the present invention, there is provided a wafer processing method comprising the steps of securing the entirety of a wafer which is provided, on its right side, with a surface protection tape adhered thereto, to a frame by a dicing tape adhered to the underside of the wafer; irradiating the dicing tape of the wafer with ultraviolet light; and detaching the surface protection tape from the right side of the wafer, wherein the order of the occurrence of an irradiating operation for irradiating the dicing tape with ultraviolet light by the ultraviolet light irradiating means and a detaching operation for detaching the surface protection tape by the detaching means is determined based on a relation between the adhesive force of the surface protection tape and the adhesive force of the dicing tape before and after an ultraviolet light irradiating operation carried out by the ultraviolet light irradiating means.

Namely, according to the above aspects of the present invention, as the order of the occurrence of an ultraviolet light irradiating operation for the dicing tape and a detaching operation for detaching the surface protection tape is determined in accordance with the adhesive force of these tapes, a wafer can be handled in accordance with the property of the surface protection tape and/or the dicing tape. In such a case, the wafer is prevented from being pulled when the surface protection tape is detached and, thus, damaged, because the adhesive force of the surface protection tape is larger than that of the dicing tape.

BRIEF DESCRIPTION OF THE DRAWINGS

FIG. 3 is a flowchart of a program executed by a wafer processing apparatus;

FIG. 5a is a flowchart of yet another program executed by a wafer processing apparatus;

FIG. 5b is a flowchart of yet another program executed by a wafer processing apparatus;

FIG. 6 is a flowchart of yet another program executed by a wafer processing apparatus;

FIG. 7a is a flowchart of a program in which a surface protection tape is not detached; and FIG. 7b is a flowchart of a program in which a surface protection tape is not detached.

BEST MODE FOR CARRYING OUT THE INVENTION

Figure 1:
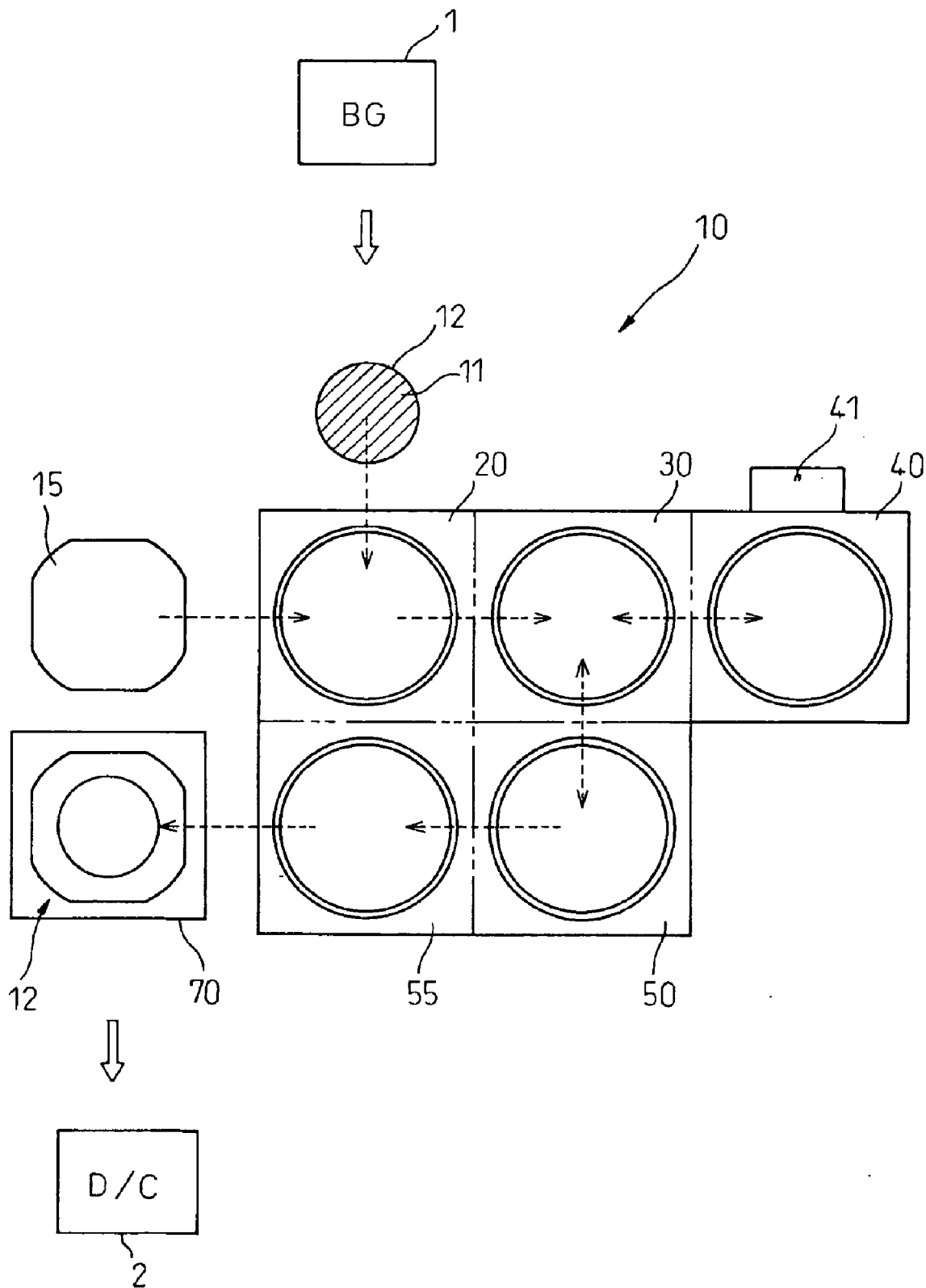
FIG. 1 is a schematic view of a wafer processing apparatus according to the present invention.

Embodiments of the present invention will be described below with reference to the accompanying drawings. In the following drawings, the same members are designated by the same reference numerals. For easy understanding, the scale is changed as necessary in the drawings.

Figure 2A:
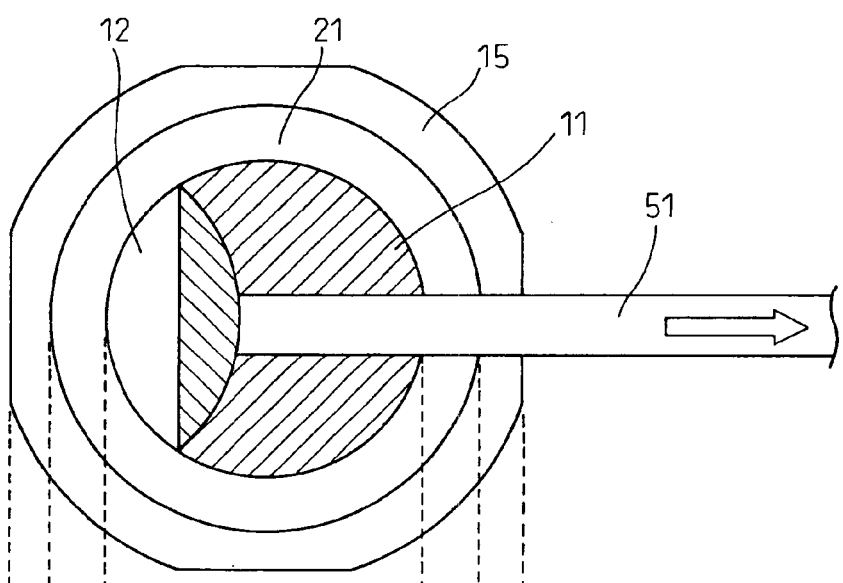
FIG. 2a is a schematic plan view showing a detachment of the surface protection tape.
Figure 2B:
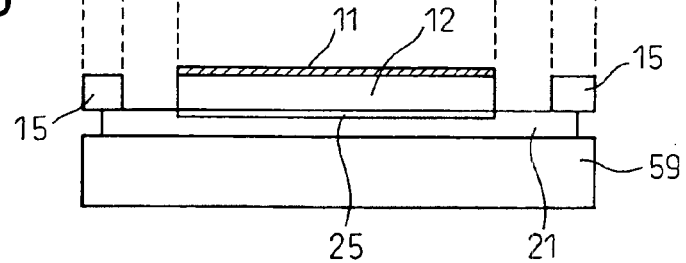
FIG. 2b is a sectional view of a wafer attached to a frame.

FIG. 1 is a schematic view of a wafer processing apparatus according to the present invention. FIG. 2a is a schematic plan view of a surface protection tape being peeled off. FIG. 2b is a sectional view of a wafer attached to a frame. As described above, because the right side of a wafer is sucked and held when the underside of the wafer is ground, the surface protection tape 11 is, in advance, adhered to the right side of a wafer 12 (see FIG. 2b). If the surface protection tape 11 has an ultraviolet light curing property, the surface protection tape 11 on the wafer 12 whose underside is ground by a back grinder (BG) 1, is irradiated with ultraviolet light by an ultraviolet light irradiating portion 90 (not shown) for the surface protection tape. If the adhesion property of the surface protection tape 11 does not vary when it is subject to ultraviolet light irradiation, the ultraviolet light irradiating portion 90 for the surface protection tape is not used. As shown in FIG. 1, the wafer 12 is supplied to a wafer processing apparatus 10.

As shown in FIG. 1, the wafer processing apparatus 10 contains a mount unit 20 in which the wafer 12 is attached to a frame 15. The wafer 12 having the right side to which the surface protection tape 11 is adhered, and the underside that is ground by the back grinder 1, is supplied to the mount unit 20 by a loader (not shown). Likewise, the frame 15 is supplied to the mount unit 20 by another loader (not shown). In the mount unit 20, after a dicing tape 21 is adhered to the above-described underside of the wafer 12, the wafer 12 is mounted on the frame 15 (see FIG. 2b). Finally, the dicing tape 21 is cut in accordance with the shape of the frame 15. It is difficult to handle the wafer 12 having the underside ground by the back grinder 1 because the thickness of the wafer is reduced. However, the handling of the wafer 12 can be facilitated, in a subsequent process, by mounting the wafer 12 onto the frame 15, as described above.

A die attach film tape (DAF tape) can be adhered to the underside of the wafer 12 before the dicing tape 21 is adhered to the underside of the wafer 12. The DAF tape functions as an adhesive on the bottom face of a die in a die bonding operation after dicing operation. As shown in FIG. 2b, the dicing tape 21 on which a die attach film (DAF) 25 having a shape substantially identical to that of the wafer 12 is, in advance, provided, may be used. The properties of the surface protection tape 11 and the dicing tape 21 will be described later in detail. The dicing tape 21 contains the die attach film 25 unless otherwise specified.

The wafer processing apparatus 10 contains an inverting unit 30 for inverting the wafer 12. The wafer 12 mounted on the frame 15 (see FIG. 2b) is transferred to the inverting unit 30. In the inverting unit 30, the wafer 12 is inverted in the up-and-down direction. As a matter of course, it is possible to pass the wafer 12 through the inverting unit 30 without inverting the wafer 12.

Moreover, the wafer processing apparatus 10 contains an ultraviolet light irradiating unit, i.e., an ultraviolet light (hereinafter called "UV light" as necessary) irradiating unit 40. The UV light irradiating unit 40 is provided with an UV lamp 41, and irradiates one of sides of the wafer 12, e.g., the surface on which the dicing tape 21 is provided, with a desired amount of ultraviolet light.

Moreover, the wafer processing unit 10 contains a detaching unit 50 for detaching the surface protection tape 11. FIG. 2a shows a detachment of the surface protection tape 11. As shown in FIG. 2a, in the detaching unit 50, the wafer 12 is disposed so that a right side thereof, to which the surface protection tape 11 is adhered, faces upward. A relatively narrow detaching tape 51 disposed, in advance, in the detaching unit 50 is attached to the surface protection tape 11 in the vicinity of an edge portion of the wafer 12. After that, the detaching tape 51 is pulled toward the edge portion of the wafer 12 opposite to the above edge portion, so that the surface protection tape 11 is gradually detached from one end thereof and, finally, the entirety of the surface protection tape 11 is detached from the wafer 12.

As shown in FIG. 1, a receiving portion 70 is disposed in the vicinity of the lower left side of the wafer processing apparatus 10 in the drawing. The wafer 12, processed in a desired manner in the wafer processing apparatus 10, is received in a cassette of the receiving portion 70. Then, the wafer 12 from the detaching unit 50 passes through a passing unit 55. The passing unit 55 may be omitted because a processing operation, on the wafer 12, is not carried out in the passing unit 55.

As indicated by dotted arrows in FIG. 1, the wafer 12 can be transferred from the mount unit 20 to the inverting unit 30, and from the detaching unit 50 to the receiving unit 70. Additionally, the wafer 12 can be transferred between the inverting unit 30 and the UV light irradiating unit 40, and between the inverting unit 30 and the detaching unit 50. A transferring device, e.g., a robot arm or the like is used to transfer the wafer 12. However, the robot arm or the like will not be illustrated and described because it is a common device.

The wafer processing apparatus 10 contains a controller 80 (not shown). The controller 80 processes the wafer 12 in each unit 20, 30, 40, 50, based on a plurality of programs stored, in advance, in a memory (not shown), e.g., a ROM or a RAM. These programs differ from each other based on the properties of the surface protection tape 11 adhered to the right side of the wafer 12 and/or the dicing tape 21 (containing the DAF or DAF tape 25) adhered to the underside of the wafer 12. The plural programs will be described below.

FIGS. 3 to 7 are flowcharts of programs executed by the wafer processing apparatus 10. A program 100 shown in FIG. 3 will be described below. The program 100 is used if the adhesive force of the dicing tape 21 is reduced because the dicing tape is cured due to UV light irradiation, i.e., the adhesive force of the dicing tape 21 is lower than that of the surface protection tape 11.

In step 101 of the program 100, as described above, the wafer 12 is mounted on the frame 15 by the dicing tape 21

(called "D/C tape" in the drawings) in the mount unit 20. In step 102, the wafer 12 is inverted by the inverting unit 30. Thus, the surface protection tape 11 of the wafer 12 faces upwardly. When the process goes to step 103, the wafer 12 is directly transferred from the inverting unit 30 to the detaching unit 50. In the step 103, the surface protection tape 11 is detached from the right side of the wafer 12 in the detaching unit 50. In step 104, the wafer 12 is returned from the detaching unit 50 to the inverting unit 30, and merely passes through the inverting unit 30. In step 105, the wafer 12 is transferred from the inverting unit 30 to the UV light irradiating unit 40, and the underside of the wafer 12, i.e., the dicing tape 21 is irradiated from below, with a predetermined amount of UV light in the UV light irradiating unit 40. After that, in step 106, the wafer 12 is transferred from the UV light irradiating unit 40 to the inverting unit 30, and merely passes through the inverting unit. The wafer 12 merely passes through the detaching unit 50 in step 107, and then is received by the receiving portion 70 in step 108. Thus, the program is complete.

In the program 100, after the surface protection tape 11 is detached, the dicing tape 21 is irradiated with UV light. In this case, the adhesive force of the dicing tape 21 is reduced due to UV light irradiation because the dicing tape 21 has an ultraviolet light curing property as described above. However, in this program, the surface protection tape 11 is detached before such UV light irradiation. Namely, when the surface protection tape 11 is detached, the adhesive force of the dicing tape 21 is larger than that of the surface protection tape 11, and the sucking and holding force of a sucking and holding table 59 is naturally larger than the adhesive force of the dicing tape 21. Therefore, the wafer 12 is processed in the above-described order, so that the wafer 12 itself does not rise by pulling the detaching tape 51. As a result, the wafer 12 is not damaged.

Figure 4:
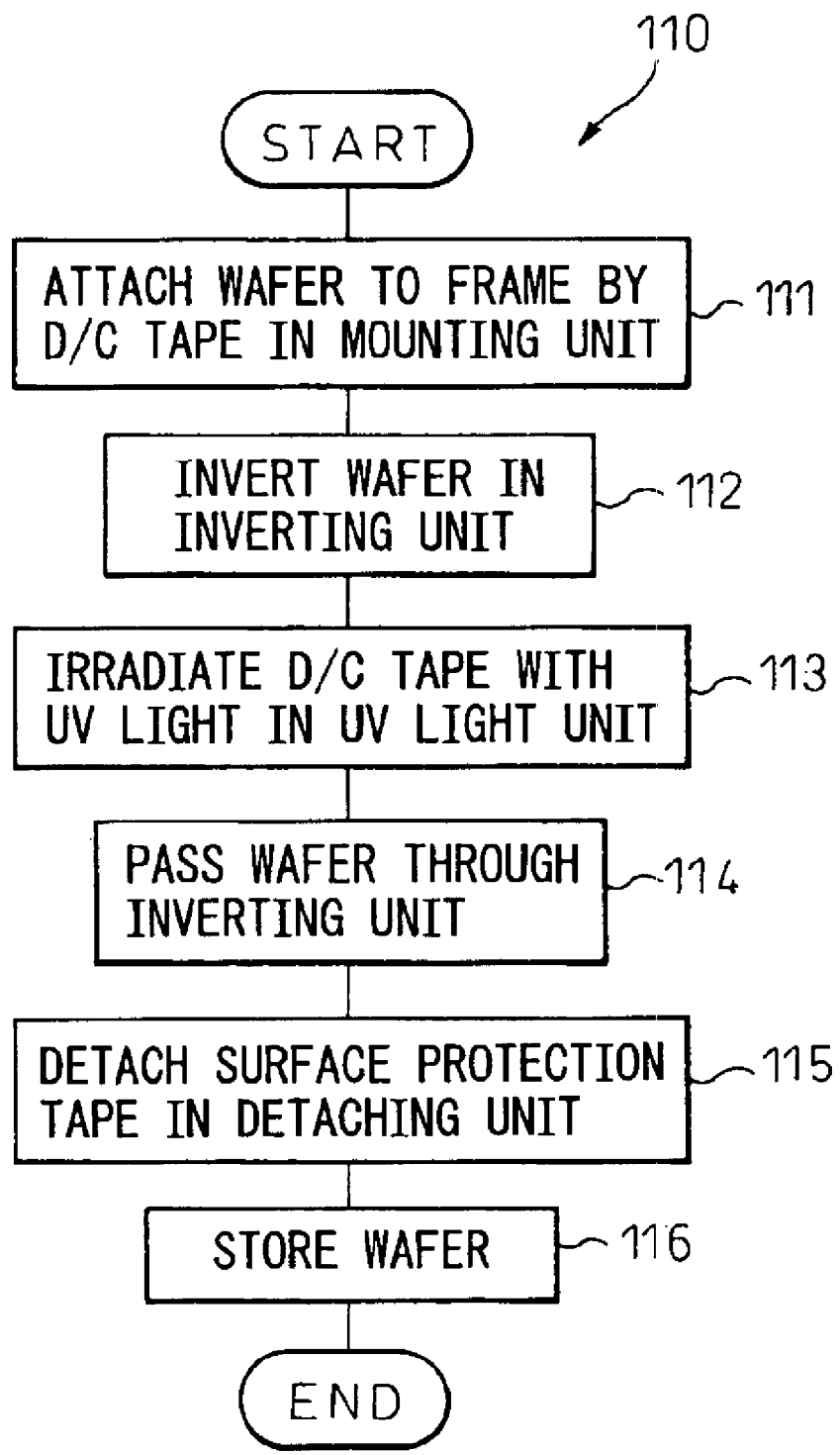
FIG. 4 is a flowchart of another program executed by a wafer processing apparatus.

FIG. 4 is a flowchart of another program executed by the wafer processing apparatus. Another program 110 will be described below with reference to FIG. 4. It is assumed, in the program 110, that the adhesive force of the dicing tape 21 does not vary even when it is irradiated with UV light and the adhesive force of the surface protection tape 11 is smaller than that of the dicing tape 21, or the adhesive force of the dicing tape is increased when it is irradiated with UV light.

In step 111 of the program 110, as described above, the wafer 12 is mounted on the frame 15 by the dicing tape 21 in the mount unit 20. After that, in step 112, the wafer 12 is transferred to the inverting unit 30 and, then, is inverted in the inverting unit 30. Thus, the underside of the wafer 12, on which the dicing tape 21 is adhered, faces downward. In step 113, the wafer 12 is transferred from the inverting unit 30 to the UV light irradiating unit 40, the underside of the wafer 12, i.e., the dicing tape 21 is irradiated from below, with a predetermined amount of UV light in the UV light irradiating unit 40. After that, in step 114, the wafer 12 is transferred from the UV light irradiating unit 40 to the inverting unit 30, and merely passes through the inverting unit 30. When the process goes to step 115, the wafer 12 is transferred from the inverting unit 30 to the detaching unit 50. In the step 115, the surface protection tape 11 is detached from the right side of the wafer 12 in the detaching unit 50. In step 116, the wafer 12 is received by the receiving portion 70. Thus, the program is completed.

The program 110 can be adopted if the adhesive force of the dicing tape 21 does not vary when it is irradiated with UV light and the adhesive force of the dicing tape 21 is larger than that of the surface protection tape 11. In the program 110, the surface protection tape 11 is detached after the dicing tape 21 is irradiated with UV light. The sucking and holding force of the sucking and holding table 59 is naturally larger than the adhesive force of the dicing tape 21. Therefore, the wafer 12 is processed in the above-described order, so that the wafer 12 itself does not rise by pulling the detaching tape 51. As a result, the wafer 12 is not damaged. The program 110 can be also adopted if the dicing tape 21 whose adhesive force is increased by being irradiated with UV light, is used, because the adhesive force of the dicing tape 21 is larger than that of the surface protection tape 11 when the surface protection tape 11 is detached.

FIGS. 5a and 5b are flowcharts of other programs 120 and 130, respectively. In the program 120, it is assumed that the adhesive force of the surface protection tape 11 is reduced due to UV light irradiation and the adhesive force of the dicing tape 21 does not vary when it is subject to UV light irradiation. In the program 130, it is assumed that the adhesive forces of the surface protection tape 11 and that of the dicing tape 21 are reduced due to UV light irradiation.

A program 120 will be described below. As in the above-described programs, in step 121, the wafer 12 is mounted on the frame 15 by the dicing tape 21 in the mount unit 20. After that, in step 122, the wafer 12 is inverted in the inverting unit 30. Thus, the surface protection tape 11 on the wafer 12 faces upwardly. When the process goes to step 123, the wafer 12 is transferred from the inverting unit 30 to the detaching unit 50. In the step 123, the surface protection tape 11 is detached from the right side of the wafer 12 in the detaching unit 50. In step 124, the wafer 12 is received by the receiving portion 70.

In the program 120, the dicing tape 21 is not irradiated with UV light. However, as described above, the adhesive force of the surface protection tape 11 has already been reduced because the surface protection tape 11 is irradiated with UV light by the ultraviolet light irradiating portion 90 for the surface protection tape, before being supplied to the wafer processing apparatus 10. Therefore, even if the adhesive force of the surface protection tape 11 is larger than that of the dicing tape 21 before ultraviolet light irradiation, the adhesive force of the surface protection tape 11 is smaller than that of the dicing tape 21 when the surface protection tape 11 is detached. Consequently, the wafer 12 is processed in the above-described order, so that the wafer 12 itself does not rise and is not damaged when the surface protection tape 11 is detached.

A program 130 will be described below. As described above, in the program 130, it is assumed that the adhesive force of the surface protection tape 11 and that of the dicing tape 21 are reduced. In step 131, as described above, the wafer 12 is mounted on the frame 15 by the dicing tape 21 in the mount unit 20. After that, in step 132, the wafer 12 is inverted in the inverting unit 30. Thus, the surface protection tape 11 on the wafer 12 faces upwardly. When the process goes to step 133, the wafer 12 is transferred from the inverting unit 30 to the detaching unit 50. In the step 133, the surface protection tape 11 on the right side of the wafer 12 is detached in the detaching unit 50. When the process goes to step 134, the wafer 12 is returned from the detaching unit 50 to the inverting unit 30 and, then, merely passes through the inverting unit 30. Thus, the underside of the wafer 12, to which the dicing tape 21 is adhered, faces downward. In step 135, the wafer 12 is transferred from the inverting unit 30 to the UV light irradiating unit 40, and the underside of the wafer 12, i.e., the dicing tape 21 is irradiated, from below, with a predetermined amount of UV light in the UV light irradiating unit 40. After that, in step 136, the wafer 12 is transferred from the UV light irradiating unit 40 to the inverting unit 30 and, then, merely passes through the inverting unit 30. The wafer 12 passes through the detaching unit 50 in step 137 and, then, is received by the receiving portion 70 in step 138. Thus, the program is completed.

Because the adhesive force of the surface protection tape 11 has already been reduced due to UV light irradiation in the UV light irradiating portion 90 for the surface protection tape, the protection tape 11 can be easily detached in the program 130. In the program 130, it is assumed that the surface protection tape 11 is irradiated with UV light in the UV light irradiating portion 90 for the surface protection tape, before the dicing tape 21 is irradiated with UV light. However, the surface protection tape 11 can be irradiated with UV light after the dicing tape 21 is irradiated with UV light. However, it is preferable that the adhesive force of the surface protection tape 11 is smaller than that of the dicing tape 21 when the surface protection tape 11 is detached. Accordingly, as shown in the program 130, it is preferable that the dicing tape 21 be irradiated with UV light after the surface protection tape 11 is detached. Therefore, the wafer 12 is processed in the above-described order, so that the wafer 12 itself does not rise and is not damaged with almost complete reliability when the surface protection tape 11 is detached.

FIG. 6 is a flowchart of yet another program 150. In the program 150, it is assumed that the adhesive force and the hardness of the dicing tape 21 do not vary even when it is irradiated with UV light, and the adhesive force of the dicing tape 21 is larger than that of the surface protection tape 11.

In step 151 of the program 150, as described above, the wafer 12 is mounted on the frame 15 by the dicing tape 21 in the mount unit 20. After that, in step 152, the wafer 12 is inverted in the inverting unit 30. Thus, the surface protection tape 11 on the wafer 12 faces upwardly. When the process goes to step 153, the wafer 12 is directly transferred from the inverting unit 30 to the detaching unit 50. In the step 153, the surface protection tape 11 on the right side of the wafer 12 is detached in the detaching unit 50. In step 154, the wafer 12 is received by the receiving portion 70.

The program 150 is executed when the adhesive force and the hardness of the dicing tape 21 do not vary when it is subject to UV light irradiation, and the adhesive force of the dicing tape 21 is larger than that of the surface protection tape 11. Therefore, the wafer 12 is processed in the above-described order, so that the wafer 12 itself does not rise and is not damaged when the surface protection tape 11 is detached.

FIG. 7a is a flowchart of a program in which the surface protection tape 11 is not detached, and FIG. 7b is a flowchart of a program in which there is no surface protection tape 11. A program 160 will be described below with reference to FIG. 7a.

In step 161 of the program 160, as described above, the wafer 12 is mounted on the frame 15 by the dicing tape 21 in the mount unit 20. After that, in step 162, the wafer 12 is inverted in the inverting unit 30. Thus, the surface protection tape 11 on the wafer 12 faces upwardly. In step 163, the wafer 12 is transferred from the inverting unit 30 to the UV light irradiating unit 40, and the underside of the wafer 12, i.e., the dicing tape 21 is irradiated from below, with a predetermined amount of UV light in the UV light irradiating unit 40. After that, in step 164, the wafer 12 is transferred from the UV light irradiating unit 40 to the inverting unit 30 and, then, merely passes through the inverting unit 30. The wafer 12 merely passes through the detaching unit 50 in step 165 and, then, is received by the receiving portion 70 in step 166. Thus, the program is completed. The program 160 is adopted when it is necessary to irradiate the dicing tape 21 with UV light because the adhesive force of the dicing tape 21 varies due to UV light irradiation, although the surface protection tape 11 is not detached or there is no surface protection tape 11.

A program 170 will be described below with reference to FIG. 7b. In step 171 of the program 170, as described above, the wafer 12 is mounted on the frame 15 by the dicing tape 21 in the mount unit 20. After that, in step 172, the wafer 12 is inverted in the inverting unit 30. Thus, the surface protection tape 11 on the wafer 12 faces upwardly. The wafer 12 passes through the detaching unit 50 in step 173 and, then, is received by the receiving portion 70 in step 174. Thus, the program is completed. The program 170 is adopted when it is unnecessary to detach the surface protection tape 11 because the dicing tape 21 whose adhesive force does not vary when it is subject to UV light irradiation, is used, or no surface protection tape 11 is provided.

A plurality of programs 100, 110, 120, 130, 150, 160 and 170 has been described above. The adoption of the program is determined in accordance with the kind (i.e., the property) of the surface protection tape 11 and the dicing tape 21 to be used. On the other hand, in a mass production process, the kind of surface protection tape 11 and the dicing tape 21 to be used is already determined based on, at least, the lot-number of products. Therefore, the adoption of the program can be determined based on the lot-number of products. A cassette, in which the wafer 12 or the frame 15, or lots of the wafers 12 is housed, is provided with an ID, i.e., an identification mark. Accordingly, it is preferable that the number of the program be included in the ID. In this case, the ID of the wafer 12, the frame 15, or the cassette is read by a specific reader (not shown) provided on the wafer processing apparatus 10. Thus, the program of the wafer processing apparatus 10 is automatically set in accordance with a program number included in the ID. In such a case, the order of the occurrence of, especially, an UV light irradiating operation for the dicing tape 21 and a detaching operation for the surface protection tape 11 is automatically determined and, then, these operations are carried out. Therefore, an operating error due to carelessness of an operator, i.e., a damage of the wafer 12 caused when the surface protection tape 11 is detached, can be prevented. When a wafer is processed by a device in a wafer processing operation, e.g., the back grinder 1, the ID may be read by a reader (not shown) of the back grinder 1, to automatically send the content of the ID to the wafer processing apparatus 10 before a process in the wafer processing apparatus 10 begins. In this case, an operation time in the wafer processing apparatus 10 can be reduced. As a matter of course, a manual operation of the wafer processing apparatus 10 is contained within the scope of the present invention.

The wafer processing apparatus 10 shown in FIG. 1 is provided with the passing unit 55. However, it is possible to exclude the passing unit 55, and, for example, to replace the passing unit 55 with the detaching unit 50 and replace the detaching unit 50 with the UV light irradiating unit 40. In this case, it is necessary to transfer the wafer 12, in an oblique direction, from the inverting unit 30 to the detaching unit 50. However, the area of an installation site of the wafer processing apparatus 10 can be reduced because the entirety of the wafer processing apparatus 10 is shaped into a substantial square.

According to the present invention, a common effect, in which a wafer can be handled in accordance with the property of a surface protection tape and/or a dicing tape, can be obtained.

What is claimed is:

1. A wafer processing apparatus comprising
a mounting means in which a dicing tape is adhered to the underside of a wafer having a right side to which a surface protection tape is adhered, and the entirety of the wafer is secured to a frame;
an ultraviolet light irradiating means which irradiates the dicing tape of the wafer with ultraviolet light; and
a detaching means in which the surface protection tape is detached from the right side of the wafer, wherein
the order of the occurrence of an irradiating operation for irradiating the dicing tape with ultraviolet light by the ultraviolet light irradiating means and a detaching operation for detaching the surface protection tape by the detaching means is determined, based on a relation between the adhesive force of the surface protection tape and the adhesive force of the dicing tape before and after an ultraviolet light irradiating operation carried out by the ultraviolet light irradiating means.

2. A wafer processing apparatus according to claim 1, further comprising
a recognizing means which reads and recognizes a recognition mark provided on at least one of the wafer and the frame, wherein
information representing a relation between the adhesive force of the surface protection tape and the adhesive force of the dicing tape before and after an ultraviolet light irradiating operation carried out by the ultraviolet light irradiating means, is included in the recognition mark.

3. A wafer processing apparatus according to claim 1 or 2, wherein
if the dicing tape has an ultraviolet light curing property, so that the dicing tape is cured when it is subject to ultraviolet light irradiation, to reduce the adhesive force thereof, the dicing tape is irradiated with ultraviolet light by the ultraviolet light irradiating means after the surface protection tape is detached by the detaching means.

4. A wafer processing apparatus according to any one of claim 1 or 2, wherein
if the adhesive force of the dicing tape does not vary when ultraviolet is irradiated thereon, and the adhesive force of the dicing tape is larger than that of the surface protection tape, the surface protection tape is detached by the detaching means after the dicing tape is irradiated with ultraviolet light by the ultraviolet light irradiating means.

5. A wafer processing method comprising the steps of
securing the entirety of a wafer which is provided on its right side with a surface protection tape adhered thereto, to a frame by a dicing tape adhered to the underside of the wafer;
irradiating the dicing tape of the wafer with ultraviolet light; and
detaching the surface protection tape from the right side of the wafer, wherein
the order of the occurrence of an irradiating operation for irradiating the dicing tape with ultraviolet light by the ultraviolet light irradiating means and a detaching operation for detaching the surface protection tape by the detaching means is determined, based on a relation between the adhesive force of the surface protection tape and the adhesive force of the dicing tape before and after the ultraviolet light irradiating operation.

6. A wafer processing method according to claim 5, further comprising the step of reading and recognizing a recognition mark provided on at least one of the wafer and the frame, wherein
information representing a relation between the adhesive force of the surface protection tape and the adhesive force of the dicing tape before and after the ultraviolet light irradiating operation is carried out, is included in the recognition mark.

7. A wafer processing method according to claim 5 or 6, wherein
if the dicing tape has an ultraviolet light curing property, so that the dicing tape is cured when it is subject to ultraviolet light irradiation, to reduce the adhesive force thereof, the dicing tape is irradiated with ultraviolet light after the surface protection tape is detached.

8. A wafer processing method according to any one of claim 5 or 6, wherein
if the adhesive force of the dicing tape does not vary when ultraviolet is irradiated thereon, and the adhesive force of the dicing tape is larger than that of the surface protection tape, the surface protection tape is detached by the detaching means after the dicing tape is irradiated with ultraviolet light.

* * * * *